(12) United States Patent
Kloiber et al.

(10) Patent No.: US 9,370,109 B2
(45) Date of Patent: Jun. 14, 2016

(54) SENSOR DEVICE AND METHOD FOR MANUFACTURE

(71) Applicant: EPCOS AG, Munich (DE)

(72) Inventors: Gerald Kloiber, Feldkirchen (AT); Heinz Strallhofer, Deutschlandsberg (AT); Norbert Freiberger, Graz (AT)

(73) Assignee: EPCOS AG, Munich (DE)

( * ) Notice: Subject to any disclaimer, the term of this patent is extended or adjusted under 35 U.S.C. 154(b) by 89 days.

(21) Appl. No.: 14/166,509

(22) Filed: Jan. 28, 2014

(65) Prior Publication Data

US 2014/0137402 A1    May 22, 2014

Related U.S. Application Data

(60) Division of application No. 13/016,723, filed on Jan. 28, 2011, now Pat. No. 8,705,245, which is a continuation of application No. PCT/EP2009/060306, filed on Aug. 7, 2009.

(30) Foreign Application Priority Data

Aug. 7, 2008 (DE) .......................... 10 2008 036 837

(51) Int. Cl.
*H05K 1/16*    (2006.01)
*H05K 3/32*    (2006.01)
(Continued)

(52) U.S. Cl.
CPC ................ *H05K 3/321* (2013.01); *G01K 1/026* (2013.01); *G01K 1/14* (2013.01); *G01K 7/22* (2013.01); *H05K 1/0306* (2013.01); *H05K 1/092* (2013.01); *H05K 3/1291* (2013.01); *H05K 2201/10636* (2013.01); *H05K 2203/1126* (2013.01); *H05K 2203/1131* (2013.01); *H05K 2203/1453* (2013.01); *Y02P 70/611* (2015.11); *Y10T 29/4913* (2015.01); *Y10T 29/49103* (2015.01);
(Continued)

(58) Field of Classification Search
CPC ............. H05K 1/11; H05K 1/16; H05K 1/18; H05K 3/00; H05K 3/06; H05K 3/24; H05K 3/30; H05K 3/32; H05K 3/34; H05K 3/40; H05K 7/20; H01L 21/00; H01L 21/02; H01L 21/60; H01L 33/00; H03G 15/20; H05B 3/00; H05B 3/12
USPC ............. 29/832, 611; 219/216, 553; 174/252, 174/260, 261; 361/56, 761; 257/98, 678, 257/689; 438/112; 338/22 R, 28
See application file for complete search history.

(56) References Cited

U.S. PATENT DOCUMENTS 4,238,848 A * 12/1980 Yamaguchi et al. .......... 368/276
4,242,659 A    12/1980 Baxter et al.
(Continued)

FOREIGN PATENT DOCUMENTS

DE    10358778 A1    7/2004
DE    102004047725 A1    4/2006
(Continued)

*Primary Examiner* — Xiaoliang Chen
(74) *Attorney, Agent, or Firm* — Slater Matsil, LLP

(57) ABSTRACT

A sensor device has a ceramic carrier substrate. At least two conductor tracks are arranged on the carrier substrate. The sensor device has at least one ceramic component that is in the form of a chip and is connected to the conductor tracks in an electrically conductive manner. The at least one ceramic component is mechanically connected to the conductor tracks by means of a screen printing paste which has been burnt in.

6 Claims, 2 Drawing Sheets

(51) Int. Cl.
  *G01K 1/02* (2006.01)
  *G01K 1/14* (2006.01)
  *G01K 7/22* (2006.01)
  *H05K 1/03* (2006.01)
  *H05K 1/09* (2006.01)
  *H05K 3/12* (2006.01)

(52) U.S. Cl.
  CPC .... *Y10T 29/49128* (2015.01); *Y10T 428/24926* (2015.01)

(56) References Cited

U.S. PATENT DOCUMENTS

| | | | |
|---|---|---|---|
| 4,257,061 A | | 3/1981 | Chapel et al. |
| 4,346,291 A | | 8/1982 | Chapel et al. |
| 4,447,799 A | | 5/1984 | Carlson |
| 4,766,027 A | * | 8/1988 | Burn ............... 428/210 |
| 4,841,273 A | * | 6/1989 | Horton ............. 338/28 |
| 4,970,027 A | * | 11/1990 | Honda et al. ........ 252/520.21 |
| 5,019,944 A | | 5/1991 | Ishii et al. |
| 5,022,263 A | | 6/1991 | Uriu et al. |
| 5,037,488 A | | 8/1991 | Wienand |
| 5,089,071 A | * | 2/1992 | Tominaga et al. ........ 156/89.17 |
| 5,098,611 A | * | 3/1992 | Honda et al. ........ 252/518.1 |
| 5,321,382 A | | 6/1994 | Mizukoshi et al. |
| 5,391,604 A | * | 2/1995 | Dietz et al. ........ 524/403 |
| 5,410,291 A | * | 4/1995 | Kuzuoka ........ 338/22 R |
| 5,561,411 A | | 10/1996 | Kuzuoka |
| 5,600,296 A | | 2/1997 | Kuzuoka et al. |
| 5,610,571 A | | 3/1997 | Kuzuoka |
| 5,665,914 A | | 9/1997 | Yamamoto |
| 5,700,338 A | * | 12/1997 | Kubodera et al. ........ 156/89.16 |
| 5,726,624 A | * | 3/1998 | Caffee et al. ........ 338/28 |
| 5,759,737 A | * | 6/1998 | Feilchenfeld et al. ........ 430/311 |
| 6,073,340 A | * | 6/2000 | Shirai et al. ........ 29/611 |
| 6,095,424 A | | 8/2000 | Prancz |
| 6,107,630 A | | 8/2000 | Mazurowski et al. |
| 6,123,874 A | * | 9/2000 | Fukaya et al. ........ 252/518.1 |
| 6,248,978 B1 | * | 6/2001 | Okuda ........ 219/216 |
| 6,326,239 B1 | * | 12/2001 | Asai et al. ........ 438/112 |
| 6,395,658 B1 | * | 5/2002 | Taira et al. ........ 501/32 |
| 6,568,849 B1 | | 5/2003 | Chen et al. |
| 6,783,077 B1 | | 8/2004 | Fannasch ........ 235/492 |
| 7,629,581 B2 | * | 12/2009 | Hayashi ........ 250/338.3 |
| 7,709,766 B2 | | 5/2010 | Gambino et al. |
| 7,719,401 B2 | * | 5/2010 | Nyffenegger ........ 338/28 |
| 7,746,212 B2 | * | 6/2010 | Zitzmann et al. ........ 338/22 R |
| 7,791,150 B1 | | 9/2010 | Seal et al. |
| 8,020,286 B2 | | 9/2011 | Inoue et al. |
| 8,033,016 B2 | | 10/2011 | Hibino et al. |
| 2001/0037895 A1 | | 11/2001 | Gotoh et al. |
| 2002/0005247 A1 | * | 1/2002 | Graham et al. ........ 156/291 |
| 2002/0066903 A1 | | 6/2002 | Parsons et al. |
| 2002/0118027 A1 | * | 8/2002 | Routkevitch et al. ........ 324/694 |
| 2002/0135377 A1 | * | 9/2002 | Farruggia et al. ........ 324/441 |
| 2002/0175154 A1 | * | 11/2002 | Karube et al. ........ 219/216 |
| 2002/0186860 A1 | | 12/2002 | Ogura et al. |
| 2003/0015574 A1 | | 1/2003 | Teshima et al. |
| 2003/0056665 A1 | | 3/2003 | Tanaka |
| 2003/0147196 A1 | | 8/2003 | Gotoh et al. |
| 2003/0178396 A1 | * | 9/2003 | Naumov et al. ........ 219/121.69 |
| 2003/0196740 A1 | * | 10/2003 | Kaji et al. ........ 156/89.14 |
| 2003/0222335 A1 | * | 12/2003 | Hirano et al. ........ 257/678 |
| 2004/0035843 A1 | | 2/2004 | Hamilton et al. |
| 2004/0161949 A1 | | 8/2004 | Yadav |
| 2004/0222211 A1 | | 11/2004 | Hiramatsu et al. |
| 2004/0232923 A1 | | 11/2004 | Farruggia et al. |
| 2005/0011878 A1 | | 1/2005 | Ito et al. |
| 2005/0012429 A1 | * | 1/2005 | Sato et al. ........ 310/311 |
| 2005/0023269 A1 | | 2/2005 | Hiramatsu et al. |
| 2005/0029244 A1 | | 2/2005 | Ito et al. |
| 2005/0029666 A1 | | 2/2005 | Kurihara et al. |
| 2005/0045618 A1 | | 3/2005 | Ito |
| 2005/0050959 A1 | * | 3/2005 | Ooba et al. ........ 73/775 |
| 2005/0062583 A1 | | 3/2005 | Naumov et al. |
| 2005/0077808 A1 | | 4/2005 | Hitzschke et al. |
| 2005/0092733 A1 | | 5/2005 | Ito et al. |
| 2005/0118404 A1 | | 6/2005 | Hamilton et al. |
| 2005/0122030 A1 | * | 6/2005 | Sakamoto et al. ........ 313/496 |
| 2005/0130292 A1 | | 6/2005 | Ahn et al. |
| 2005/0285117 A1 | | 12/2005 | Parsons et al. |
| 2006/0017152 A1 | | 1/2006 | White et al. |
| 2006/0088692 A1 | | 4/2006 | Ito et al. |
| 2006/0096084 A1 | | 5/2006 | Hamilton et al. |
| 2006/0192492 A1 | | 8/2006 | Ushifusa et al. |
| 2006/0218779 A1 | | 10/2006 | Ooba et al. |
| 2006/0293168 A1 | * | 12/2006 | Mori et al. ........ 501/136 |
| 2007/0089525 A1 | | 4/2007 | Momose et al. |
| 2007/0114058 A1 | | 5/2007 | Tsukahara et al. |
| 2007/0158101 A1 | * | 7/2007 | Chikagawa et al. ........ 174/260 |
| 2007/0158103 A1 | * | 7/2007 | Wada et al. ........ 174/260 |
| 2008/0023713 A1 | * | 1/2008 | Maeda et al. ........ 257/98 |
| 2008/0056331 A1 | | 3/2008 | Matias et al. |
| 2008/0135283 A1 | | 6/2008 | Hibino et al. |
| 2008/0190173 A1 | | 8/2008 | Wienand et al. |
| 2008/0224815 A1 | * | 9/2008 | Inoue et al. ........ 338/21 |
| 2008/0224816 A1 | * | 9/2008 | Inoue et al. ........ 338/21 |
| 2008/0225449 A1 | * | 9/2008 | Inoue et al. ........ 361/56 |
| 2008/0254567 A1 | | 10/2008 | Konno |
| 2008/0264166 A1 | | 10/2008 | Wienand et al. |
| 2008/0316721 A1 | | 12/2008 | Maki |
| 2009/0014716 A1 | | 1/2009 | Yamaga et al. |
| 2009/0025782 A1 | | 1/2009 | Ojima et al. |
| 2009/0161022 A1 | | 6/2009 | Suzuki et al. |
| 2009/0173526 A1 | | 7/2009 | Kloiber et al. |
| 2009/0211355 A1 | * | 8/2009 | Renninger et al. ........ 73/204.26 |
| 2009/0218668 A1 | | 9/2009 | Zhe et al. |
| 2010/0089620 A1 | * | 4/2010 | Matz et al. ........ 174/252 |

FOREIGN PATENT DOCUMENTS

| | | |
|---|---|---|
| DE | 102006031344 A1 | 1/2008 |
| JP | 02087032 | 3/1990 |
| JP | 04233701 | 8/1992 |
| JP | 07111206 | 4/1995 |
| JP | 07220903 | 8/1995 |
| JP | 829267 A | 2/1996 |
| JP | 11148873 | 6/1999 |
| JP | 11326072 A | 11/1999 |
| JP | 2001141574 A | 5/2001 |
| JP | 2001237105 A | 8/2001 |
| JP | 2004507728 A | 3/2004 |
| JP | 2009543322 A | 12/2009 |
| WO | 2008003287 A2 | 1/2008 |

* cited by examiner

SENSOR DEVICE AND METHOD FOR MANUFACTURE

This is a divisional application of U.S. application Ser. No. 13/016,723, filed on Jan. 28, 2011, which is continuation of International Application No. PCT/EP2009/060306, filed Aug. 7, 2009, which claims priority to German Application No. 10 2008 036 837.7, filed Aug. 7, 2008, all of which applications are incorporated herein by reference.

BACKGROUND

German patent publication no. 10 2006 031 344 A1 discloses a sensor arrangement in which a sensor element is arranged in a plate arrangement.

SUMMARY

In one aspect a sensor device has a simple and stable structure.

A sensor device comprises a ceramic carrier, where at least two conductor tracks are arranged on the carrier substrate. The sensor device has at least one ceramic component that is in the form of a chip and is connected to the conductor tracks of the ceramic carrier substrate in an electrically conductive manner.

The ceramic component preferably comprises a temperature-dependent resistance which can be used to convert a detected physical variable into an electrical signal.

The following features of the ceramic component are described, by way of example, for one or more NTC elements.

However, the following features also apply to any other desired ceramic component which is suitable for converting a physical variable into an electrical measurement signal.

The ceramic component is preferably in the form of a temperature-resistant temperature sensor. In one advantageous embodiment, the ceramic component is in the form of an NTC element and comprises a body containing NTC ceramic. In this case, NTC stands for Negative Temperature Coefficient. The NTC element is preferably in the form of an unpackaged ceramic chip. The NTC ceramic is preferably resistant to aging. The NTC ceramic preferably has a high degree of sensitivity with respect to a temperature measurement. The NTC ceramic comprises, for example, a manganese/nickel ceramic which preferably has a spinel structure.

The at least one NTC element is connected to the conductor tracks of the ceramic carrier substrate of the sensor device in a mechanically fixed manner by means of a screen printing paste which has been burnt in. A mechanical connection between the NTC element and the carrier substrate by means of a screen printing paste achieves a solder-free connection which is suitable for detecting high temperatures. Screen printing pastes containing silver or silver/platinum are preferably used.

Connections by means of soldering have a restricted field of application since, even at relatively low temperatures, they reach a transition region between solid, at their solidus temperature, and liquid, at the liquidus temperature, and thus are no longer suitable for a stable connection.

In one embodiment, the sensor device has at least two NTC elements which are connected in parallel with one another.

In another embodiment, the sensor device may have two NTC elements which are connected in series with one another.

In another embodiment, it is also possible for both NTC elements which are connected in parallel and NTC elements which are connected in series with one another to be arranged on the carrier substrate of the sensor device.

In one embodiment, two NTC elements which are arranged on different conductor tracks of the carrier substrate are preferably connected to one another by means of an electrically conductive bridge. In one embodiment, the bridge comprises the same material as the carrier substrate of the sensor device.

In one embodiment which has a plurality of NTC elements, for example, the sensor device is also designed to detect a plurality of individual temperatures or the average temperature of an inhomogeneous temperature field.

In one embodiment, the sensor device has at least two NTC elements, each NTC element being electrically contact-connected by means of at least one separate conductor track.

In another embodiment, at least two NTC elements of a sensor device, for example, have at least one common conductor track via which the NTC elements are jointly electrically contact-connected.

A sensor device having two or more NTC elements makes it possible to simultaneously measure the temperature at different locations with an appropriate design of the conductor tracks. The NTC elements may be electrically contact-connected in series, in parallel or independently of one another via separate conductor tracks for this purpose.

A sensor device like that described above is particularly suitable for detecting a plurality of temperatures of an inhomogeneous temperature field if it is fitted with a plurality of NTC elements. In the case of a sensor device having at least two elements, it is possible to detect the temperatures of an inhomogeneous temperature field.

The sensor device described above is particularly suitable for detecting temperatures in the range of up to 1,000° C. In one preferred embodiment, the sensor device is particularly suitable for detecting temperatures in the region of 300° C. As a result of the use of a ceramic carrier substrate and solder-free fastening of the sensor to the substrate, the sensor device is suitable for detecting temperatures up to 1,000° C. In principle, the field of application of the sensor device is restricted only by the NTC ceramic used since NTC ceramics begin to drift as of a certain temperature.

In one embodiment, the NTC element comprises a ceramic chip which is preferably in direct electrical contact with at least one of the conductor tracks. In another embodiment, the ceramic chip is in electrical contact with at least two conductor tracks.

In one embodiment, the ceramic chip of the NTC element has a full-area contact area on its surfaces. The contact area is preferably applied, in the form of a metallization made of electrically conductive screen printing paste, to two opposite surfaces of the NTC element which form connection regions of the component.

In another embodiment, the metallization made of electrically conductive screen printing paste is applied in the form of a strip, the metallization preferably being applied in the region of two opposite lateral edges. This makes it possible to set the resistance of the ceramic component in a very accurate manner. The metallization preferably overlaps the lateral edges with respect to the main surfaces of the NTC element. The metallizations form connection regions of the component, which regions can be used to electrically contact-connect the component.

In another embodiment, the NTC elements are free of metallizations.

NTC elements which have a full-area metallization made of electrically conductive screen printing paste on both sides are particularly suitable for serial connection by means of an electrically conductive bridge. In the case of a simple structure of the sensor device, in which only one or more NTC elements which are connected in parallel with one another are used, the NTC elements preferably have a metallization which is in the form of a strip and is made of electrically conductive screen printing paste in the region of the lateral edges.

In order to make it possible to contact-connect a flat NTC element in a plane, the metallization made of electrically conductive screen printing paste of the NTC element is preferably in the form of a strip. In another embodiment, however, the NTC element may also be free of metallizations. In a metallization-free embodiment of the NTC element, the latter is contact-connected, while the screen printing paste is being burnt in, by the screen printing paste which has been burnt in. In this case, a metallization-free NTC element is arranged on a screen printing paste, which has not been burnt in and forms the conductor tracks, and is burnt in, in a common burning process.

The ceramic carrier substrate is preferably formed from a material with good thermal conductivity. In the case of a sensor device having one or more NTC elements which are thermally well coupled, it is possible to detect the average temperature of a temperature field.

The conductor tracks preferably comprise a metal material whose melting point is above the upper application temperature of the sensor device. This ensures sufficiently good temperature stability of the conductor track.

In one embodiment, the carrier substrate has a thickness which is less than the other dimensions. The diameter in the case of a circular carrier substrate and the length or width in the case of a square carrier substrate are preferably greater than the thickness of the carrier substrate. In one embodiment, the carrier substrate has a rectangular base surface. However, the carrier substrate may have any desired shape.

A carrier substrate having a very small thickness and the use of NTC elements in the form of unpackaged ceramic chips make it possible to keep the total overall height of the sensor device very low.

In one embodiment, the ceramic carrier substrate can be considered to be an electrical insulator in a wide temperature range, but at least up to the upper application temperature. This ensures, for example, sufficiently good electrical insulation between a carrier substrate, in which conductor tracks are printed on a first side, and the second, opposite side of the carrier substrate.

The sensor device preferably comprises such materials that interact between the sensor device and an external time-dependent magnetic field can be considered to be negligible.

In order to manufacture a sensor device, a method is specified, in which at least one NTC element in the form of a chip on a ceramic carrier substrate provided is connected to the carrier substrate in a mechanically fixed manner by means of an electrically conductive screen printing paste which can be burnt in.

In a first embodiment of the method for manufacturing a sensor device, an electrically conductive screen printing paste is applied to a ceramic carrier substrate provided and forms at least two conductor tracks on the carrier substrate. At least one NTC element is arranged on the carrier substrate, the NTC element electrically contact-connecting the screen printing paste which has been printed on via at least two connection regions of the NTC element. The connection regions are formed by an electrically conductive screen printing paste which has been applied to the NTC element. At least one first connection region of the NTC element is in direct electrical contact with the screen printing paste. A second connection region may either be in direct or indirect electrical contact, for example, via a contact bridge and a further NTC element. In a further method step, the screen printing paste is burnt into the ceramic carrier substrate and the NTC element. As a result of the screen printing paste being burnt into the ceramic carrier substrate and the NTC element, the at least one NTC element, the carrier substrate and the screen printing paste which has been burnt in form a mechanically stable connection during the burning process.

In another embodiment of a method for manufacturing a sensor device, a screen printing paste is applied to a ceramic carrier substrate provided and forms at least two conductor tracks on the carrier substrate. The screen printing paste is burnt into the ceramic carrier substrate in a first burning process. At least one NTC element is then arranged on the conductor tracks, the NTC element at least being in electrical contact with the conductor tracks by means of an applied electrically conductive screen printing paste after it has been burnt in. The at least one NTC element may be either in direct or indirect electrical contact with a further conductor track which has been burnt in. In a second burning process, the at least one NTC element and the screen printing paste applied to the conductor tracks enter a mechanically stable connection during the burning process.

The subject matter described above are explained in more detail using the following figures and exemplary embodiments.

BRIEF DESCRIPTION OF THE DRAWINGS

The drawings described below should not be interpreted as being true-to-scale. Rather, individual dimensions may be illustrated on an enlarged, reduced or else distorted scale for the purpose of better illustration. Elements which are the same as one another or which undertake the same functions are denoted using the same reference symbols.

The following list of reference symbols may be used in conjunction with the drawings:
1 Carrier substrate
2a, 2b Conductor track
3, 3a, 3a', 3b, 3b' NTC element
4, 4a, 4b Metallization
5, 5a, 5b Electrically conductive bridge
6 Contact region

DETAILED DESCRIPTION OF ILLUSTRATIVE EMBODIMENTS

Figure 1:
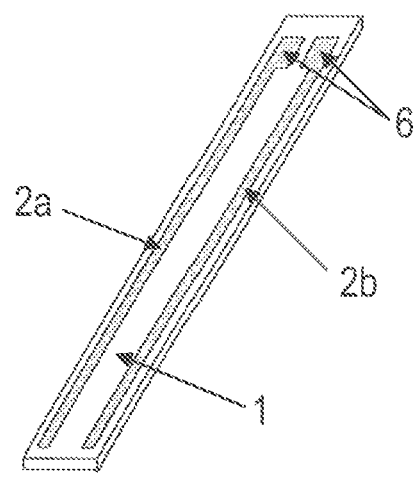
FIG. 1 shows a ceramic carrier substrate.

FIG. 1 shows a ceramic carrier substrate 1 of a first embodiment of the sensor device. The ceramic carrier substrate 1 preferably has the smallest dimensions in the region of its thickness. Two conductor tracks 2a, 2b which were applied to the carrier substrate 1 by means of a screen printing method are arranged on the ceramic carrier substrate 1. In order to produce the conductor tracks 2a, 2b, a screen printing paste containing silver or silver/platinum, for example, was applied to the carrier substrate 1 by means of a screen printing method.

The screen printing paste is burnt into the ceramic carrier substrate 1 and the ceramic component under the action of very high temperatures. The burning-in process is preferably carried out at temperatures in the range of approximately 700° C. to 900° C.

The screen printing paste which has been burnt in preferably forms the conductor tracks 2a, 2b on a top side of the carrier substrate 1. In the embodiment illustrated, the conductor tracks 2a, 2b have contact regions 6 in the region of one end of the carrier substrate 1. The contact regions 6 may be, for example, in the form of separate connection pads, in the form of widened conductor tracks or in some other form. The contact regions 6 are used to electrically contact-connect the sensor device. As illustrated in FIG. 1, the contact regions 6 are preferably accessible from a common side of the carrier substrate 1. However, it is also possible for the contact regions 6 to be arranged on different sides of the carrier substrate 1 by means of plated-through holes.

In one possible embodiment, at least one ceramic component, which is illustrated by way of example as an NTC element in FIGS. 2 to 5, is arranged on the carrier substrate 1 and is directly heated with the screen printing paste. Alternatively, at least one ceramic component may also be baked with the conductor tracks 2a, 2b in a further, separate burning-in step by means of a screen printing paste.

Figure 2:
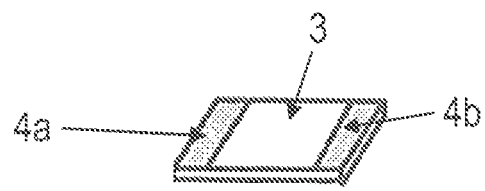
FIG. 2 shows one embodiment of a ceramic component in the form of an NTC element with metallizations in the form of strips.

FIG. 2 shows one embodiment of a ceramic component in the form of an NTC element 3. The NTC element 3 is preferably in the form of an unpackaged ceramic chip (die). In the embodiment illustrated, the NTC element 3 has metallizations 4a, 4b, which are in the form of strips and can extend over the lateral regions of the NTC element 3 as far as the lateral edges of the latter, on a surface of the NTC element 3 in the region of two opposite lateral edges. It is also possible for the metallizations 4a, 4b in the form of strips to extend beyond the lateral edges as far as the opposite underside of the NTC element 3. A metallization 4a, 4b in the form of a strip electrically contact-connects the NTC element 3, for example, via two conductor tracks beside one another, after the screen printing paste has been burnt in.

In another embodiment (not illustrated), the metallization 4 which is made of an electrically conductive screen printing paste may also be applied to the entire area of the top side and underside of the NTC element 3. In this embodiment, a first metallized side of the NTC element 3 constitutes a first electrical contact for a conductor track or for a further electrical component after the screen printing paste has been burnt in. The second electrical contact of the NTC element 3 is electrically contact-connected via the second metallized side of the NTC element 3.

Figure 3:
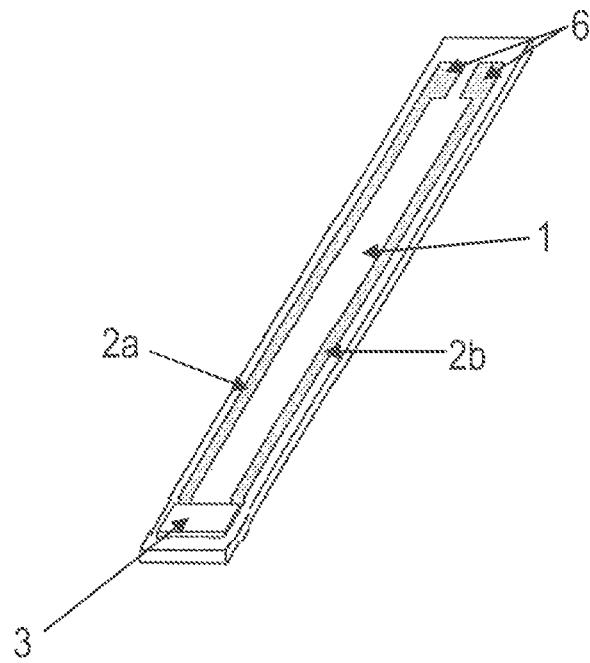
FIG. 3 shows a first embodiment of the sensor device having one NTC element.

FIG. 3 illustrates a first embodiment of the sensor device having one NTC element 3. In an end region, the NTC element 3 is directly connected to the conductor tracks 2a, 2b of the carrier substrate 1 in an electrically conductive manner. In the embodiment illustrated, the NTC element 3 preferably has metallizations, which are in the form of strips and are made of electrically conductive screen printing paste, in the region of the lateral edges, which metallizations are not illustrated in FIG. 3 since they are preferably arranged on the underside of the NTC element 3 in this embodiment. The NTC element 3 is connected to the conductor tracks 2a, 2b in a temperature-resistant, mechanically fixed and electrical manner. The NTC element 3 is connected to the conductor tracks 2a, 2b by means of a screen printing paste. In a burning step, the NTC element 3 is baked with the screen printing paste of the conductor tracks 2a, 2b or with a screen printing paste which has been additionally applied to the conductor tracks 2a, 2b which have already been burnt in, thus resulting in a high-temperature-resistant, electrically conductive and mechanically stable connection between the conductor tracks 2a, 2b of the carrier substrate 1 and the NTC element 3.

Figure 4:
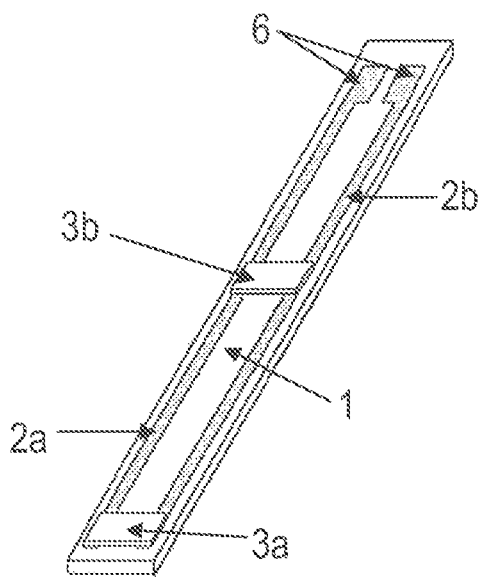
FIG. 4 shows another embodiment of the sensor device having two NTC elements which are connected in parallel with one another.

FIG. 4 shows another embodiment of the sensor device in which two NTC elements 3a, 3b are connected in parallel with one another. The two NTC elements 3a, 3b are preferably arranged at a distance from one another with respect to the longest extent of the carrier substrate 1. In the embodiment illustrated, the NTC elements 3a, 3b are connected in parallel with one another via the conductor tracks 2a, 2b. An arrangement in which the NTC elements 3a, 3b are arranged at a distance from one another on the carrier substrate 1 makes it possible, for example, to detect the average temperature of an inhomogeneous temperature field. The first NTC element 3a detects the temperature in a first region of the inhomogeneous temperature field and the second NTC element 3b detects the temperature in a second region, the temperatures of the first and second regions differing from one another. The output signal from the two NTC elements 3a, 3b produces an electrical signal which can be used to determine the average temperature of the two temperature regions, for example.

In another embodiment (not illustrated), two NTC elements may have a common forward line and separate return lines, for example. This makes it possible, for example, to determine the different temperatures of an inhomogeneous temperature field separately from one another, preferably at the same time.

The use of more than two NTC elements, for example, in the case of a parallel circuit, makes it possible to determine a more exact average temperature of an inhomogeneous temperature field. In the case of a connection with separate return lines, it is possible to determine a plurality of temperatures of an inhomogeneous temperature field.

Figure 5:
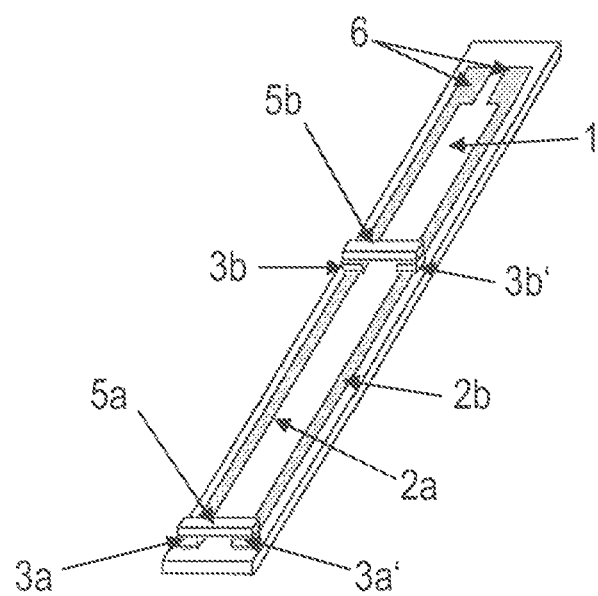
FIG. 5 shows another embodiment of the sensor device having four NTC elements, two series-connected NTC elements of which are respectively connected in parallel with one another.

FIG. 5 illustrates another embodiment of the sensor device having four NTC elements 3a, 3a', 3b, 3b', two series-connected NTC elements 3a, 3a' and 3b, 3b' respectively being connected in parallel with one another. In the embodiment illustrated, the NTC elements 3a, 3a', 3b, 3b' preferably have a full-area metallization made of electrically conductive screen printing paste on both sides, which metallization is not illustrated in FIG. 5. In order to contact-connect the NTC elements 3a, 3a', 3b, 3b', a first side of the latter is preferably in direct contact with one of the two conductor tracks 2a, 2b on the carrier substrate 1. Two first NTC elements 3a, 3a' are respectively electrically connected to one another via the second side of the NTC elements 3a, 3a', 3b, 3b' by means of an electrically conductive contact bridge 5a. The second pair of NTC elements 3b, 3b' is likewise electrically connected by means of an electrically conductive contact bridge 5b. The contact bridges 5a, 5b preferably comprise the same ceramic material as the carrier substrate 1. The contact bridges 5a, 5b have at least one conductor track which is used to electrically connect at least two NTC elements 3a, 3a' or 3b, 3b' to one another.

The NTC elements 3a, 3a', 3b, 3b' are preferably mechanically and electrically connected to the conductor tracks 2a, 2b and to the electrically conductive contact bridges 5a, 5b by means of electrically conductive screen printing paste applied to both sides. The connection of the first sides of the NTC elements 3a, 3a', 3b, 3b' to the conductor tracks 2a, 2b by means of screen printing paste can also already be carried out together with the operation of burning the screen printing paste of the conductor tracks 2a, 2b into the ceramic carrier substrate 1. In one embodiment, it is also possible for the connection of the second sides of the NTC elements 3a, 3a', 3b, 3b' to the respective electrically conductive contact bridges 5a, 5b by means of electrically conductive screen printing paste to be carried out in a first joint burning step together with the operation of burning in the conductor tracks 2a, 2b.

Although only a restricted number of possible developments of the invention could be described in the exemplary embodiments, the invention is not restricted to these developments. In principle, it is possible for the sensor device to have a plurality of NTC elements which are connected via separate conductor tracks, with the result that the different temperatures of an inhomogeneous temperature field can be detected.

The invention is not restricted to the number of elements illustrated. The description of the subject matters stated here is not restricted to the individual specific embodiments, but rather the features of the individual embodiments can be combined with one another as desired insofar as technically useful.

What is claimed is:

1. A method of manufacturing a sensor device, the method comprising:
    providing a ceramic carrier substrate; and
    connecting a ceramic component in the form of a chip to the carrier substrate in a mechanically fixed manner using an electrically conductive screen printing paste that can be burnt in, the connecting the ceramic component to the carrier substrate comprising:
        applying the screen printing paste to the ceramic carrier substrate thereby forming at least two conductor tracks on the carrier substrate;
        arranging the ceramic component on the carrier substrate such that the ceramic component electrically contacts and connects the screen printing paste via at least two connection regions; and
        performing a burning-in process so that the screen printing paste is burnt into the ceramic carrier substrate and the ceramic component, wherein the ceramic component and the screen printing paste enter a mechanically stable connection during the burning process.

2. The method as claimed in claim 1, wherein connecting comprises applying the electrically conductive screen printing paste to the carrier substrate and to at least one connection region of the ceramic component.

3. The method as claimed in claim 2, wherein the applied screen printing paste of the carrier substrate and of the ceramic component are connected.

4. The method as claimed in claim 3, further comprising performing a burning-in operation after the applied screen printing paste of the carrier substrate and of the ceramic component are connected.

5. The method as claimed in claim 1, wherein arranging the ceramic component on the carrier substrate comprises arranging a plurality of ceramic components on the carrier substrate.

6. The method as claimed in claim 1, wherein the sensor device is designed to detect temperatures up to 1,000° C.

* * * * *